United States Patent [19]

Blanchard et al.

[11] Patent Number: 4,682,405
[45] Date of Patent: Jul. 28, 1987

[54] METHODS FOR FORMING LATERAL AND VERTICAL DMOS TRANSISTORS

[75] Inventors: Richard A. Blanchard, Los Altos; James D. Plummer, Mt. View, both of Calif.

[73] Assignee: Siliconix Incorporated, Santa Clara, Calif.

[21] Appl. No.: 757,582

[22] Filed: Jul. 22, 1985

[51] Int. Cl.$^4$ .................. H01L 21/425; H01L 21/465
[52] U.S. Cl. ...................................... 29/571; 29/578; 29/580; 29/576 B
[58] Field of Search ............ 29/571, 578, 580, 576 W, 29/576 B

[56] References Cited

U.S. PATENT DOCUMENTS

| | | | |
|---|---|---|---|
| 4,102,714 | 7/1978 | DeBar et al. | 148/187 |
| 4,402,127 | 9/1983 | Pham et al. | 29/571 |
| 4,454,646 | 6/1984 | Joy et al. | 29/576 W |
| 4,454,647 | 6/1984 | Joy et al. | 29/576 W |
| 4,502,208 | 3/1985 | McPherson | 29/584 |
| 4,516,143 | 5/1985 | Love | 357/23.4 |
| 4,567,641 | 2/1986 | Baligg et al. | 29/580 X |
| 4,598,461 | 7/1986 | Love | 29/580 X |

OTHER PUBLICATIONS

Kendall, Don, "On Etching Very Narrow Grooves in Silicon", *Applied Physics Letters*, vol. 26, No. 4, Feb. 15, 1975, pp. 195–198.

Baliga et al., "The Insulated Gate Transistor: A New Three-Terminal MOS Controlled Bipolar Power Device", *IEEE Transactions*, vol. ED-31, No. 6, 6/84, pp. 821–828.

Pshaenich, Al, "The MOS SCR, A New Thyristor Technology", Engineering Bulletin EB-103, Motorola Inc., 1982, 5 pages.

U.S. patent application Ser. No. 811,925, Cogan et al., "High Density Vertical DMOS Transistor", filed 12/19/85.

*Primary Examiner*—George T. Ozaki
*Attorney, Agent, or Firm*—Kenneth E. Leeds; Alan H. MacPherson; Paul J. Winters

[57] ABSTRACT

A transistor is provided which includes an electrical contact (122) formed in a V-shaped groove (118). Because of the unique shape of the electrical contact, a smaller surface area is required for its formation thus rendering it possible to construct a transistor having a smaller surface area. The groove is formed by anisotropically etching an expitaxial layer (102) on a semiconductor substrate (100) using, for example, KOH.

12 Claims, 17 Drawing Figures

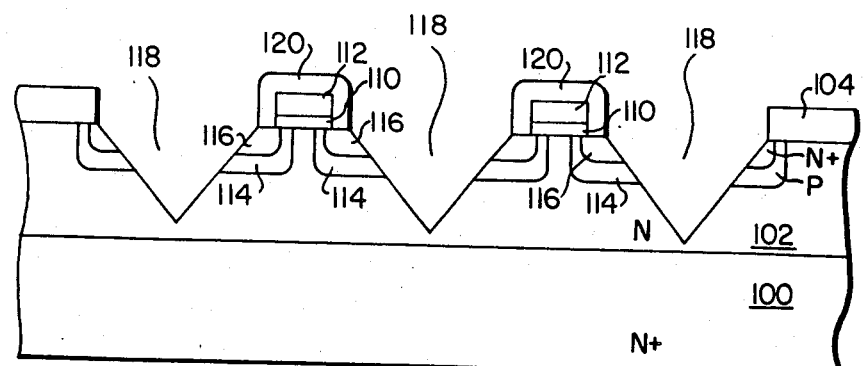
FIG. 2f
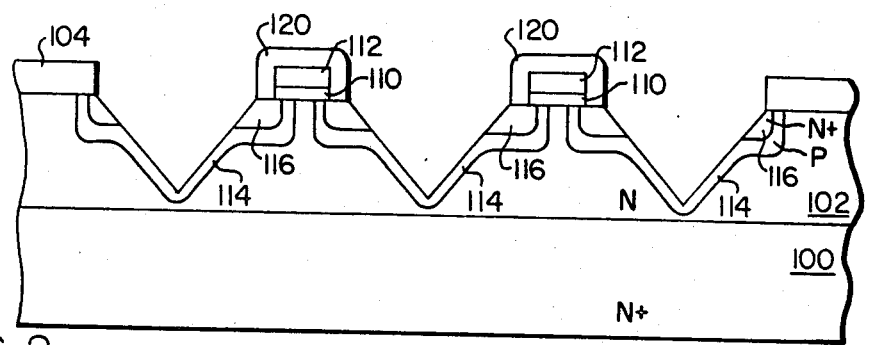
FIG. 2g
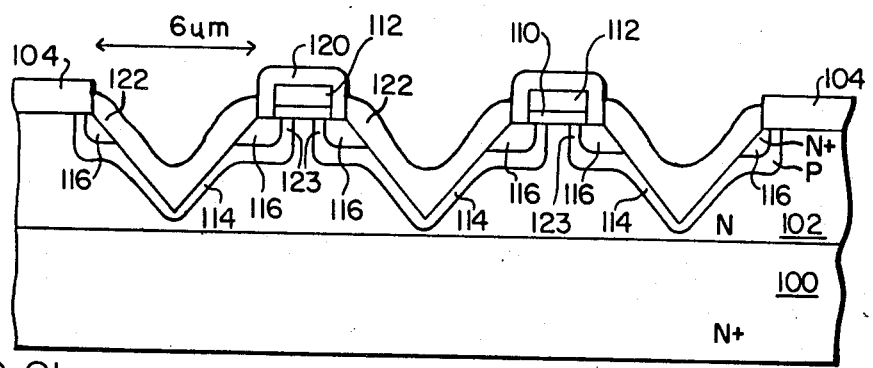
FIG. 2h
FIG. 3a
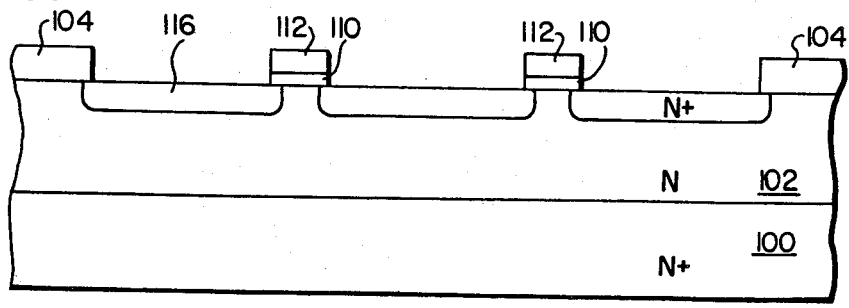

METHODS FOR FORMING LATERAL AND VERTICAL DMOS TRANSISTORS

BACKGROUND OF THE INVENTION

This invention relates to methods for fabricating electrical contacts to regions formed in a semiconductor substrate.

It is known in the art to connect metal (the term "metal" colloquially including conductive materials such as polycrystalline silicon) to various doped regions within a semiconductor substrate. FIG. 1a is a cross sectional diagram of a double diffused MOS ("DMOS") transistor constructed in accordance with the prior art. (A DMOS transistor is one in which the difference in the diffusion of sequentially introduced impurities from a common edge or boundary is used to define channel length.) Transistor 10 of FIG. 1a includes an N+ drain 12d diffused into an N type substrate 14. Included in the N-type substrate 14 is a P region 16. Within P region 16 is an N+ source 12s. Located above a portion of P region 16 is a layer of gate insulation 18 and above gate insulation 18 is a polycrystalline silicon gate 12g. As is well known in the art, when a voltage above the threshold voltage of transistor 10 is applied to gate 12g, current is permitted to flow between source 12s and drain 12d. Illustrated in FIG. 1a is a metal contact 22 and a metal contact 24. Metal contact 24 makes electrical connection to source region 12s and P region 16 while metal contact 22 makes electrical connection to drain 12d. A third metal contact (not shown) makes electrical contact to polycrystalline silicon gate 12g. (Although FIG. 1a illustrates an N channel DMOS transistor formed in an N type substrate, it is also known to form P channel DMOS transistors in a P substrate.)

A prior art variation of the transistor of FIG. 1a is illustrated in FIG. 1b. Illustrated in FIG. 1b is a transistor 50 including an N+ substrate 52 serving as a drain, located below a more lightly doped N region 54. Within N region 54 is a P+ region 56 and adjacent to P+ region 56 is a pair of N+ regions 58 and 60. Although drawn as two regions, in some prior art transistors, N+ regions 58 and 60 form a single continuous region in the surface of the substrate. Regions 58 and 60 form the source for transistor 50. Above a P region 57 (which extends from P+ region 56) is a layer of insulation 62 and layer of insulation 64. Above regions 62 and 64 are polycrystalline silicon gates 66 and 68. Although gates 66 and 68 are drawn as two separate layers, in some prior art transistors, gates 66 and 68 are a single continuous region on the surface of the substrate. Similarly, insulation layers 62 and 64 also form a continuous layer. When the voltage on gates 66 and 68 is above the threshold voltage of transistor 50, current is permitted to flow between drain region 52 and source regions 58 and 60. Illustrated in FIG. 1b is a metal contact 70 which conducts source current from transistor 50. Another metal contact (not shown) makes electrical contact to gate regions 66 and 68. This transistor is known as a vertical DMOS transistor.

As is known in the art, it is desirable to fabricate devices such as transistors 10 (FIG. 1a) and 50 (FIG. 1b) in as small a surface as possible because processed silicon is expensive and the smaller one can make devices having the same performance, the less expensive they will be. Electrical contacts such as metal contact 70 of FIG. 1b, take up a relatively large surface area. The dimensions of a typical electrical contact region are shown in FIG. 1c. As can be seen, a typical electrical contact, e.g. metal contact 70 is 6 micrometers wide for the body contact (i.e., contact to P+ region 56) and an additional 3 micrometers on each side to allow for adequate contact to source regions 58 and 60. Contacts having these dimensions provide a low resistance ohmic contact while allowing for misalignment, lateral diffusions and various effects which are taken into account in calculating the overall dimension of the device (e.g., under etching, over etching, and mask variations). The cell size in a typical DMOS device, therefore, is in the range of 20 micrometers to 40 micrometers. If it is possible to reduce the size of the electrical contacts, the size of the DMOS device can be reduced and therefore the cost of a DMOS device will also be reduced.

SUMMARY

A process for forming an electrical contact in a transistor in accordance with the present invention includes the step of providing a wafer having an N type substrate with an N type epitaxial layer formed thereon and covering the wafer with a layer of silicon dioxide. The silicon dioxide layer is then etched using conventional techniques leaving a window region where the active regions of the transistor are to be formed. Thereafter, a gate dielectric layer and a polycrystalline silicon gate region are formed in the window region and the wafer is subjected to a first ion implantation process to form a plurality of P wells and a second ion implantation process to form a plurality of N regions (the transistor source) within the P wells. The wafer is then subjected to an anisotropic etch thus forming a plurality of V-shaped grooves in the epitaxial layer. In an alternative embodiment, the grooves are flat bottomed. The grooves extend through the P wells and the N regions. The wafer is then subjected to a third ion implantation process using P type ions so that the P well (the transistor body region) extends to the bottom of the groove. The third implantation process, however, is not of sufficient dosage to counterdope the N type source. A layer of metallization such as aluminum or its alloys is then used to form an ohmic contact to the source and body regions. In this way, a transistor is provided having electrical contact with a smaller surface area.

The invention is better understood with reference to the drawings and detailed description below.

BRIEF DESCRIPTION OF THE DRAWING

FIG. 2a through 2h are cross-section illustrations of DMOS transistors during various steps of the process of one embodiment of the present invention.

FIGS. 3a through 3c are cross-section illustrations of DMOS transistors during various steps of an alternative embodiment of the process of the present invention.

DETAILED DESCRIPTION

Figure 2A:
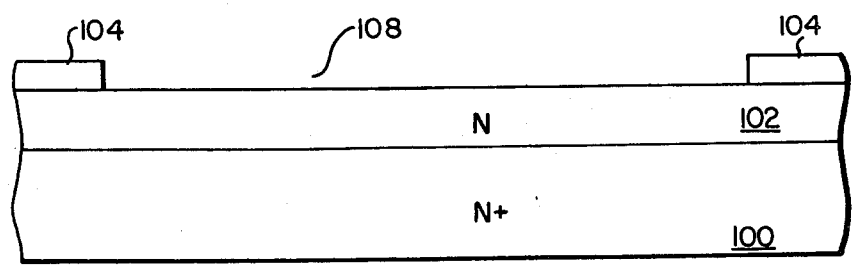

A process in accordance with one embodiment of the present invention for forming a vertical DMOS structure includes the step of starting with a wafer (typically silicon) having an N type conductivity within the range of approximately 0.005 to 0.1 ohm centimeters (in one embodiment, 0.02 ohm centimeters). In other embodiments, other dopant concentrations of either N type or P type material can be used. Thereafter, an N type epitaxial layer also typically silicon having a conductivity of approximately 0.5 to 30 ohm centimeters (in one embodiment, 2.4 ohm centimeters) and approximately 6 to 60 μm thick (in one embodiment, 13.5 μm) is provided, for example, by a process of epitaxial deposition on the substrate. FIG. 2a is an illustration of an N substrate 100 upon which N type epitaxial layer 102 is grown. Substrate 100 and epitaxial layer 102 typically have a [100] crystal orientation.

A layer of dielectric material 104 is then formed on epitaxial layer 102. In one embodiment of the invention, layer 104 is a 3000 to 8000Å thick layer of silicon dioxide which is thermally grown on epitaxial layer 102, for example, by heating the wafer to a temperature of approximately 1050° to 1200° C. for about 3 to 6 hours in an oxygen atmosphere. Alternatively, silicon dioxide layer 104 can be grown in water vapor at 900° to 1100° C. for 0.5 to 2 hours. In other embodiments of the invention, layer 104 is a combination of silicon dioxide and silicon nitride. Silicon dioxide layer 104 is then masked using conventional photolithographic techniques to expose the active areas of the to-be-formed transistor. The exposed portion of silicon dioxide layer 104 is then removed, for example using buffered HF, thus forming a window region 108. Thereafter, a layer of gate insulation 110 (FIG. 2b) is formed on the wafer and a layer of polycrystalline silicon 112 is deposited on gate insulation 110. In one embodiment of the invention, gate insulation layer 110 is silicon dioxide having a thickness within the range of approximately 500 and 1000Å, and is formed, for example, by heating the wafer in an oxygen or water vapor atmosphere at approximately 900° to 1100° C. for approximately 0.5 to 2 hours. (In other embodiments of the invention, insulation layer 110 is a combination of silicon dioxide and silicon nitride which are either grown or deposited.) Polycrystalline silicon layer 112 is typically 4000 to 6000Å thick, and is formed, for example, by a low pressure chemical vapor deposition process. Polycrystalline silicon layer 112 is doped (typically with phosphorus) to a conductivity of about 30 to 50 ohms per square and then masked using conventional photolithographic processes to define transistor gate structures. The exposed portions of polycrystalline silicion layer 112 are then etched, e.g. by plasma etching using $CF_4$ as the process gas. The remaining portion of polycrystalline silicon 112 is then used as an etching barrier while gate insulation layer 110 is etched.

Figure 2B:
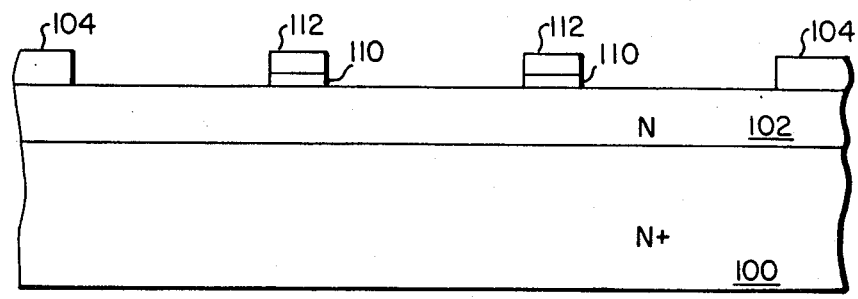
Figure 2C:
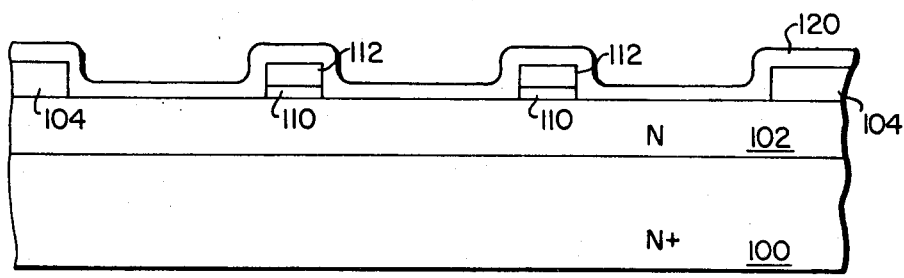

Referring to FIG. 2c, a silicon dioxide layer 120 is then formed over the wafer, e.g., by heating the wafer in oxygen for about 0.5 to 2 hours at about 1000° to 1100° C. Of importance, the portion of silicon dioxide layer 120 formed over polycrystalline silicon gate 112 is approximately 1000 to 3000 Å thick—about twice the thickness of the portion of silicon dioxide layer 120 formed over epitaxial layer 102, due to the higher dopant concentration of polycrystalline silicon 112.

Figure 2D:
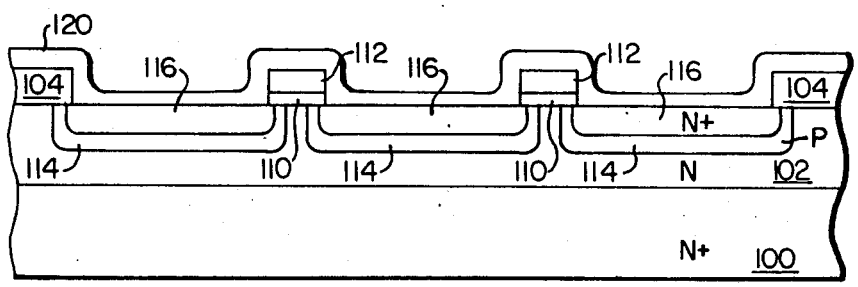

Referring to FIG. 2d, the wafer is then subjected to a P type ion implantation process, for example using boron ions to a dosage between approximately $10^{13}$ and $2 \times 10^{14}$ ions/cm$^2$ at an energy of approximately 40 to 120 KEV, thus forming a P region 114 in epitaxial layer 102. The wafer is then subjected to a diffusion process at approximately 1100° to 1200° C. for approximately 4 to 12 hours in an oxygen or nitrogen atmosphere to permit the boron to diffuse as shown. (During this diffusion process, the thickness of silicon dioxide layer 120 increases.) The wafer is then etched to thin or to remove the silicon dioxide layer 120 over the P-type region. The wafer is then subjected to an implantation of N type arsenic or phosphorus ions to a dosage between approximately $5 \times 10^{14}$ and $5 \times 10^{15}$ ions/cm$^2$ and at an implant energy of approximately 50 to 150 KEV. The wafer is then sujected to a diffusion process at approximately 1000° to 1150° C. for approximately 0.5 to 3 hours in an oxygen or nitrogen atmosphere to permit the arsenic or phosphorus to diffuse as shown. This causes the formation of an N+ source region 116. (During this diffusion process, the thickness of silicon dioxide layer 120 also increases.)

Figure 2E:
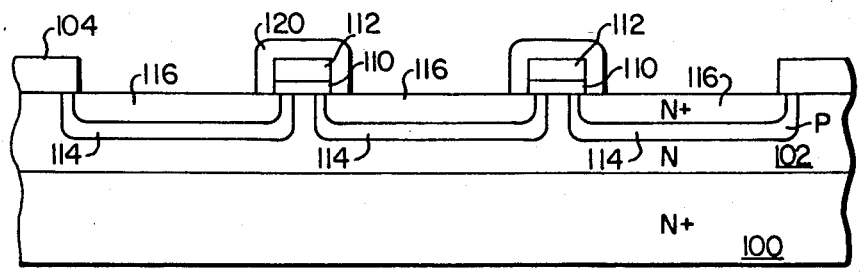

Referring to FIG. 2e, the wafer is then subjected to an HF etch to remove the portion of silicon dioxide layer 120 formed over epitaxial layer 102. Because the portion of silicon dioxide layer 120 formed over gate 112 is about twice the thickness of the portion of silicon dioxide layer 120 formed over epitaxial layer 102, this etch can be done without a mask, and the portion of silicon dioxide layer 120 over epitaxial layer 102 is removed without removing the portion of layer 120 over gate 112.

Referring to FIG. 2f, the portions of the active regions not covered by oxide layer 104 or polycrystalline silicon gates 112 are etched using an anisotropic etchant. As is known in the art, there are a variety of etchants which etch silicon anisotropically, e.g., KOH. Because KOH etches silicon along preferred axes much more rapidly than along unpreferred axes, grooves 118 are formed in epitaxial layer 102. Grooves 118 are typically 1 to 10 μm deep, depending on the width of the openings in the silicon dioxide layers 104 and 120.

As illustrated in FIG. 2g, the wafer is then subjected to another P type ion implantation process using boron ions in order to extend P region 114 (the body region) around the bottom of groove 118. The wafer receives a dosage of approximately $5 \times 10^{12}$ to $5 \times 10^{14}$ ions/cm$^2$ having an energy of about 50 to 150 KEV. Of importance, this dosage is insufficient to counterdope N+ source region 116.

Referring to FIG. 2h, a metal layer 122 such as aluminum or an alloy thereof, is then deposited on the wafer to serve as an electrical contact. In one embodiment of the invention, metal layer 122 is approximately 1 to 4 micrometers thick, deposited using a well known vacuum deposition process. Metal layer 122 is then patterned using conventional techniques such as patterning photoresist and etching the exposed portions of metal layer 122 with a solution of acetic, nitric and phosphoric acids. The remaining portions of metal layer 122 make ohmic contact to source region 116 and body region 114 to allow interconnection with other components or external lead wires and to gate 112.

The structure illustrated in FIG. 2h is a DMOS transistor. When the voltage at gate 112 is greater than the threshold voltage of the transistor, current is permitted to flow from metal layer 122, to source 116, across channel region 123, into epitaxial layer 102, through substrate 100, and to a drain contact (not shown) on the bottom of substrate 100.

Although the transistor of FIG. 2h appears to include two independent gate structures and four channels, the gates 112 are connected together, either outside of the plane of FIG. 2h or by metallization 122. Body regions 114 and sources 116 are similarly connected.

Figure 3B:
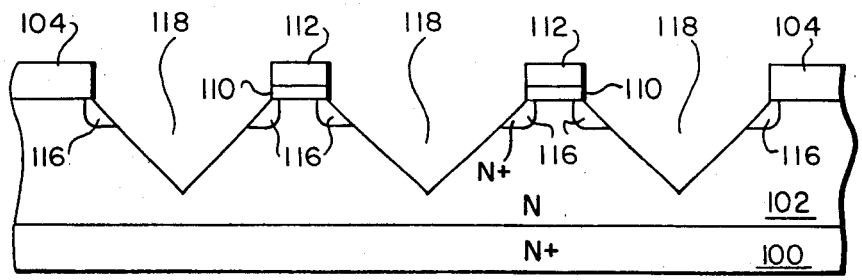
Figure 3C:
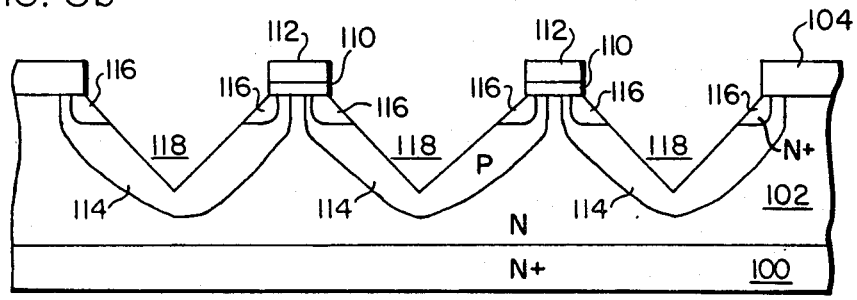

In another embodiment of the invention, instead of subjecting the wafer to a P type ion implantation process to form region 114 after forming the gate structure of FIG. 2b, the wafer is subjected to an N type implant (FIG. 3a) to form N region 116. The wafer is then anisotropically etched, for example with a KOH solution, (FIG. 3b) to form grooves 118. Then, the wafer is subjected to a P type ion implantation process (FIG. 3c) to form P type body region 114. As mentioned above, the dosage during this step is insufficient to counter-dope N+ source region 116. A layer of silicon dioxide is then grown over polycrystalline silicon gate 112 and patterned as illustrated in FIG. 2h, and metal layer 122 is deposited on the wafer as in the previous embodiment.

Figure 4A:
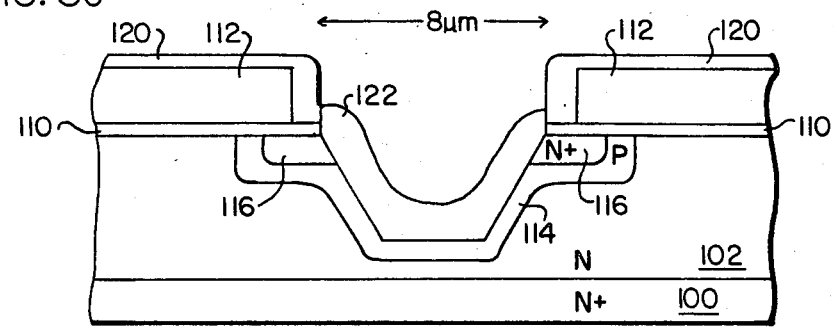
FIGS. 4a through 4c are cross-section illustrations of electrical contacts constructed in accordance with other embodiments of the present invention.

In another alternative embodiment of the invention, instead of permitting the anisotropic etchant to etch a complete V-groove in epitaxial layer 102, a flat bottomed V-groove is etched in epitaxial layer 102, as illustrated in FIG. 4a. Such a flat bottomed V-groove is formed by removing the wafer from the anisotropic etchant before it forms a complete V-groove. A flat-bottomed groove is desirable in order to minimize the electric field existing at the bottom of the groove, thereby preventing low breakdown voltage between body region 114 and epitaxial layer 102, and to ensure that the source contact metalization 122 is uniformly deposited in the V-groove in order to provide a good ohmic contact. An isotropic wet or plasma etch technique may also be used to obtain an etched region with a shape substantially like that of FIG. 4a. The operation of the device illustrated in FIG. 4a is identical to the device illustrated in FIG. 2h.

Figure 4B:
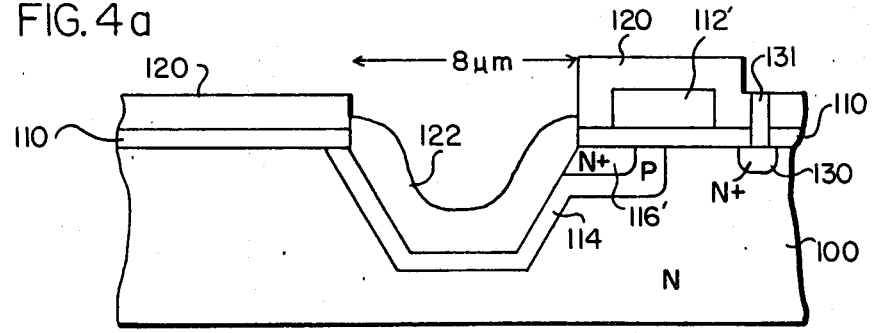
Figure 4C:
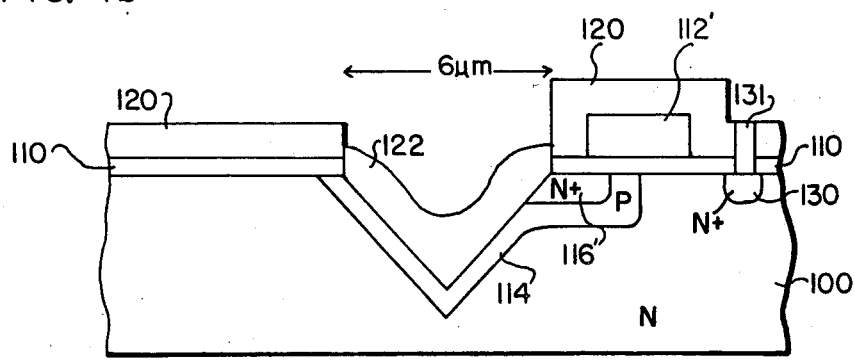

In FIGS. 4b and 4c, transistors constructed in accordance with other embodiments of the invention are illustrated. In the transistor of FIG. 4b, instead of using two source regions 116 and two gate regions 112, as in the embodiments of FIGS. 2a-2h and FIG. 4a, a single source region 116' and a single gate region 112' located on one side of groove are provided in conjunction with a flat bottom V-groove. Similarly, the transistor of FIG. 4c also includes a single gate 112' and a single source 116' in conjunction with a V-groove. Also shown is a drain region 130, forming a lateral DMOS transistor, which is formed in substrate 100. Contact metallization 131 electrically contacts drain region 130. (This structure can also be formed in an epitaxial layer.)

The dimensions for the widths of the various contacts are illustrated above the transistors in FIGS. 2h, 4a, 4b and 4c. If typical cell size is 35 micrometers wide with a 12 micrometer wide contact as shown in the prior art contact of FIG. 1c, with an 8 micrometer contact as illustrated in FIGS. 4a and 4b this invention reduces the transistor area of a square cell to $(31/35)^2$ or 78.4% of its original size (961 micrometers squared versus 1225 microns squared). This represents an area savings and a smaller die for a device having the same source to drain device on-resistance. Similarly, the contacts illustrated in FIGS. 2h and 4c reduce the transistor area to $(29/35)^2$ or 66.1% of its original size (841 micrometers squared versus 1225 micrometers squared).

Figure 1A:
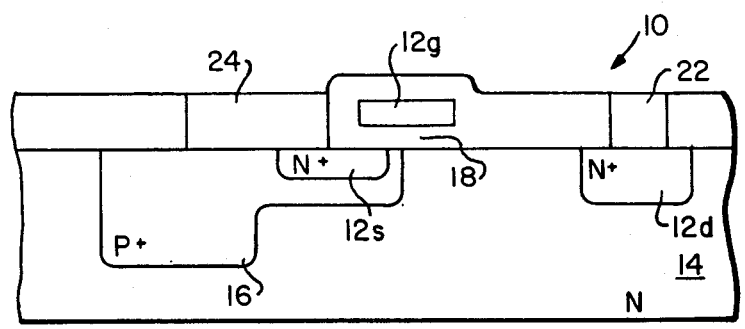
FIGS. 1a through 1c are cross-section illustrations of prior art DMOS transistors.
Figure 1B:
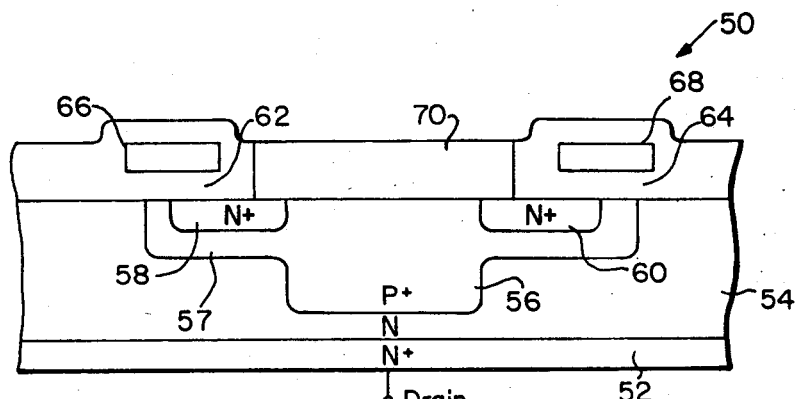
Figure 1C:
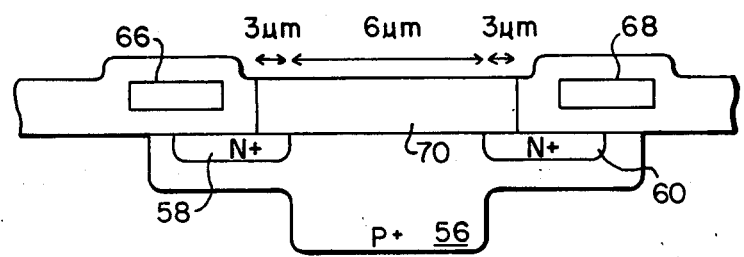

As is known in the art, in a conventional DMOS transistor (e.g., as illustrated in FIG. 1b), a rapidly changing drain voltage can cause lateral current flow in the body region 57 of the transistor below the source 60 (FIG. 1b). This behavior occurs because of the displacement current needed to charge the body-drain junction capacitance. If this current flow (I) multiplied by the resistance of the body region below the source (R) exceeds 0.6 volts ($V=I \cdot R$), the parasitic bipolar transistor (formed by source region 116, body region 114 and epitaxial layer 102) is biased on, and the breakdown character of the DMOS transistor changes considerably. Because the lateral dimension of the body region below the source in the transistor of the present invention is reduced, the DMOS transistor of the present invention is less sensitive to rapidly fluctuating drain voltage. (In one embodiment, the length of the source region of the present invention is 3 to 5 $\mu$m whereas in the prior art DMOS transistor of FIG. 1b, it is 6 to 8 $\mu$m)

The lower resistance of the body region below the source also increases the flash radiation dose needed to cause parasitic bipolar transistor turn-on or SCR latch-up in the DMOS transistor. (Referring to FIG. 2h, source region 116, body region 114, and epitaxial layer 102 form a parasitic NPN transistor, with body region 114, epitaxial layer 102, and a second body region 114' forming a parasitic PNP transistor. The parasitic NPN and PNP transistors form a parasitic SCR.) As is known in the art, flash radiation is the result of a nuclear event which causes electron-hole pairs to be generated. This caused current flow in the body region below the source, and can cause parasitic bipolar transistor turn-on or SCR latch-up as well as the problems described above which result from a rapidly changing drain voltage.

While the invention has been particularly described with reference to a specific embodiment, those skilled in the art will recognize that minor changes can be made to form and detail without departing from the spirit and scope of the invention. For example, V-groove contacts could be used in devices other than DMOS transistors, e.g. conventional MOS transistors, diodes, and any other device formed within a substrate. In addition, transistors could be formed using the present invention using either a P-type channel or an N-type channel. Also, the gate of the transistor can be either metal or a silicide as well as polycrystalline silicon. The process of the present invention can also be used to produce MOS-gated SCR's and IGT's, as well as DMOS transistors. (MOS-gated SCR's are described in "The MOS SCR, A New Thyristor Technology," by Al Pshaenich, published in *Engineering Bulletin EB*103 by Motorola, Inc. in 1982, which is hereby incorporated by reference. IGTs are described in "The Insulated Gate Transistor: A New Three-Terminal MOS-Controlled Bipolar Power Device" by B. J. Baliga et al., published in *IEEE Transactions on Electron Devices*, Vol. ED-31, No. 6, June 1984, pages 821 to 828, which is hereby incorporated by reference.) Accordingly, all such changes come within the scope of the present invention as delineated by the following claims.

We claim:

1. A method for forming a transistor comprising the steps of:

forming a gate on a first region of semiconductor material, said first region having a first conductivity type;

forming a second region having said first conductivity type within said semiconductor material, said second region having a greater dopant concentration than the dopant concentration of said first region;

etching a groove in said semiconductor material, said groove extending through said second region, said groove having a flat bottom;

forming a third region of a second conductivity type opposite said first conductivity type within said first region but surrounding said second region, said third region extending below the bottom of said groove, at least part of said third region being formed to extend below the bottom of said groove after said step of etching said groove; and depositing a layer of electrically conductive material in said groove, said electrically conductive material forming an electrical contact with said second and third region in said groove.

2. The method of claim 1 wherein said semiconductor material is silicon and wherein a silicon dioxide layer is formed on said second region between the time said second region is formed and the time said step of etching said groove is performed, said method further comprising the step of removing said silicon dioxide formed on said second region with a HF solution prior to the step of etching said groove.

3. The method of claim 1 wherein said gate is formed on a first surface of said semiconductor material, said method further comprising the step of forming electrically conductive material contacting said first region at said first surface, said electrically conductive material contacting said first region serving as a drain contact.

4. The method of claim 1 wherein said first, second, and third regions serve as the drain, source, and body, respectively, of said transistor.

5. The method of claim 1 wherein said transistor is a DMOS transistor.

6. A method for manufacturing a lateral transistor comprising the steps of:
forming a gate on a top surface of a first region of semiconductor material, said first region having a first conductivity type;
forming a second region having a second conductivity type within said first region, said second region extending to said top surface, said second conductivity type being opposite said first conductivity type;
forming a third region of said first conductivity type within said second region, said third region extending to said top surface;
etching a groove in said semiconductor material wherein at the conclusion of said process, said groove extends through said third region and at least part of said second region; and
depositing electrically conductive material in said groove and on at least part of said top surface of said first region, said electrically conductive material in said groove forming an electrical contact to said second and third regions, said electrically conductive material on said part of said top surface forming an electrical contact to said first region.

7. The method of claim 6 wherein said step of depositing electrically conductive material comprises the step of forming a layer of electrically conductive material extending in said groove and on said part of said top surface, said method further comprising the step of patterning said layer of electrically conductive material so that said electrically conductive material in said groove does not contact said electrically conductive material forming an electrical contact to said first region at said top surface.

8. A method of manufacturing a transistor comprising the steps of:
forming a gate on a first region of semiconductor material, said first region having a first conductivity type;
forming a second region having a second conductivity type opposite said first conductivity type within said first region;
forming a third region of said first conductivity type within said second region;
etching a groove extending through said second and third regions to said first region;
introducing additional dopants of said second conductivity type into said semiconductor material after said step of etching said groove, thereby extending said second region below the depth of said groove; and
forming a layer of electrically conductive material in said groove, said electrically conductive material electrically contacting said second and third regions at said groove.

9. The method of claim 8 wherein said first, second and third regions serve as the drain, body, and source, respectively, of said transistor.

10. A method for forming a transistor comprising the steps of:
forming a gate on a first region of semiconductor material, said first region having a first conductivity type;
forming a second region of said first conductivity type within said first region, said second region having a dopant concentration greater than the dopant concentration in said first region;
etching a groove through said second region to said first region; and
forming a third region of a second conductivity type opposite said first conductivity type after etching said groove so that the conductivity type of the semiconductor material at the bottom of said groove is changed from said first conductivity type to said second conductivity type, said third region extending to a depth below the depth of said groove, said third region surrounding said second region.

11. The method of claim 10 further comprising the step of forming electrically conductive material in said groove, said electrically conductive material serving as a source and body lead.

12. The method of claim 10 wherein said third region serves as the body of said transistor and said second region serves as the source of said transistor.

* * * * *